United States Patent
Kishimoto et al.

(10) Patent No.: US 11,296,272 B2
(45) Date of Patent: Apr. 5, 2022

(54) MULTILAYER PIEZOELECTRIC ELEMENT, PIEZOELECTRIC VIBRATION APPARATUS, AND ELECTRONIC DEVICE

(71) Applicant: TAIYO YUDEN CO., LTD., Tokyo (JP)

(72) Inventors: Sumiaki Kishimoto, Takasaki (JP); Hiroyuki Shimizu, Takasaki (JP); Tomohiro Harada, Takasaki (JP); Yukihiro Konishi, Takasaki (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 931 days.

(21) Appl. No.: 16/039,159

(22) Filed: Jul. 18, 2018

(65) Prior Publication Data
US 2019/0027677 A1    Jan. 24, 2019

(30) Foreign Application Priority Data

Jul. 20, 2017 (JP) .............................. JP2017-141140
Mar. 13, 2018 (JP) .............................. JP2018-045558

(51) Int. Cl.
*H01L 41/047* (2006.01)
*H01L 41/083* (2006.01)
(Continued)

(52) U.S. Cl.
CPC .......... *H01L 41/083* (2013.01); *B06B 1/0611* (2013.01); *H01L 41/0471* (2013.01);
(Continued)

(58) Field of Classification Search
CPC . H01L 41/0471; H01L 41/0472; H01L 41/09; H01L 41/0973; H01L 41/187; H01L 41/083
See application file for complete search history.

(56) References Cited

U.S. PATENT DOCUMENTS 6,208,026 B1 * 3/2001 Bindig ................ H01L 41/0472
257/718
11,094,469 B2 * 8/2021 Yun .......................... H01G 4/30
(Continued)

FOREIGN PATENT DOCUMENTS

DE        102004005528 A1 *  8/2004    ......... H01L 41/0472
JP             2016100760 A     5/2016
(Continued)

*Primary Examiner* — J. San Martin
(74) *Attorney, Agent, or Firm* — Law Office of Katsuhiro Arai

(57) ABSTRACT

A multilayer piezoelectric element includes a ceramic base body, a pair of external electrodes, multiple internal electrodes, and surface electrodes. The ceramic base body is formed by a piezoelectric ceramic. The pair of external electrodes cover a pair of end faces. The multiple internal electrodes are stacked inside the ceramic base body along a thickness direction crossing at right angles with a longitudinal direction, and connected alternately to the pair of external electrodes in the thickness direction. The surface electrodes are provided on a pair of principal faces, respectively, and are each connected to the external electrode different from the one to which the internal electrode adjacent in the thickness direction is connected. The pair of external electrodes have a higher porosity than the surface electrodes.

9 Claims, 8 Drawing Sheets

(51) Int. Cl.
*H01L 41/27* (2013.01)
*H01L 41/187* (2006.01)
*H01L 41/293* (2013.01)
*H01L 41/09* (2006.01)
*B06B 1/06* (2006.01)

(52) U.S. Cl.
CPC .......... *H01L 41/0472* (2013.01); *H01L 41/09* (2013.01); *H01L 41/0973* (2013.01); *H01L 41/187* (2013.01); *H01L 41/27* (2013.01); *H01L 41/293* (2013.01)

(56) References Cited

U.S. PATENT DOCUMENTS

| | | | | |
|---|---|---|---|---|
| 2008/0001503 | A1* | 1/2008 | Asano | H01L 41/0472 310/366 |
| 2009/0243441 | A1* | 10/2009 | Florian | H01L 41/0472 310/363 |
| 2013/0214647 | A1* | 8/2013 | Ohnishi | H01L 41/047 310/365 |
| 2015/0255237 | A1* | 9/2015 | Ottlinger | H01H 45/14 200/181 |
| 2017/0311086 | A1 | 10/2017 | Ishii et al. | |
| 2018/0108481 | A1* | 4/2018 | Tomizawa | H01G 4/2325 |
| 2020/0168400 | A1* | 5/2020 | Nakamoto | H01G 4/2325 |

FOREIGN PATENT DOCUMENTS

| | | | | |
|---|---|---|---|---|
| WO | WO-2009106410 | A1 * | 9/2009 | ........... H01L 41/257 |
| WO | 2016052582 | A1 | 4/2016 | |

* cited by examiner

MULTILAYER PIEZOELECTRIC ELEMENT, PIEZOELECTRIC VIBRATION APPARATUS, AND ELECTRONIC DEVICE

BACKGROUND

Field of the Invention

The present invention relates to a multilayer piezoelectric element, a piezoelectric vibration apparatus, and an electronic device, in which the transverse piezoelectric effect is utilized.

Description of the Related Art

Giving a multilayer piezoelectric element a long and thin shape whose dimension in the direction crossing at right angles with the stacking direction is greater, allows for effective utilization of the transverse piezoelectric effect. Such multilayer piezoelectric element can be caused to contract greatly in the longitudinal direction, by applying voltage between a pair of external electrodes provided at both of its end parts in the longitudinal direction (refer to Patent Literature 1, for example).

BACKGROUND ART LITERATURES

[Patent Literature 1] Japanese Patent Laid-open No. 2016-100760
[Patent Literature 2] International Patent Laid-open No. 2016/052582

SUMMARY

When the aforementioned multilayer piezoelectric element deforms, the pair of external electrodes move relatively in the longitudinal direction. The pair of external electrodes are formed by a metal of high specific gravity. As a result, the deformation of the multilayer piezoelectric element in the longitudinal direction is more likely hindered by the weight of the pair of external electrodes. This makes it difficult for the multilayer piezoelectric element to achieve a large degree of deformation.

In light of the above situation, an object of the present invention is to provide a multilayer piezoelectric element, a piezoelectric vibration apparatus, and an electronic device, which can ensure a large degree of deformation.

Any discussion of problems and solutions involved in the related art has been included in this disclosure solely for the purposes of providing a context for the present invention, and should not be taken as an admission that any or all of the discussion were known at the time the invention was made.

To achieve the aforementioned object, the multilayer piezoelectric element pertaining to a mode of the present invention comprises a ceramic base body, a pair of external electrodes, multiple internal electrodes, and surface electrodes.

The ceramic base body is formed by a piezoelectric ceramic, and has a pair of end faces that are facing each other in a longitudinal direction and a pair of principal faces that are facing each other in a thickness direction crossing at right angles with the longitudinal direction.

The pair of external electrodes cover the pair of end faces.

The multiple internal electrodes are stacked inside the ceramic base body along the thickness direction crossing at right angles with the longitudinal direction, and connected alternately to the pair of external electrodes in the thickness direction.

The surface electrodes are provided on the pair of principal faces, respectively, and are each connected to the external electrode different from the one to which the internal electrode adjacent in the thickness direction is connected.

The pair of external electrodes have a higher porosity than the surface electrodes.

The pair of external electrodes of this multilayer piezoelectric element are constituted by a porous conductor, and thus are lightweight. Accordingly, this multilayer piezoelectric element is less likely hindered, by the weight of the pair of external electrodes, from deforming in the longitudinal direction. As a result, this multilayer piezoelectric element can ensure a large degree of deformation.

The porosity of the pair of external electrodes may be 5 percent or higher but no higher than 15 percent.

This multilayer piezoelectric element can effectively ensure a large degree of deformation without losing the electrode function of the pair of external electrodes.

The pair of external electrodes may extend from the pair of end faces along the pair of principal faces.

Based on this constitution, the extension of the pair of external electrodes along the pair of principal faces achieves particularly good connection between the pair of external electrodes and the surface electrodes. In addition, since the pair of external electrodes are constituted by a porous conductor, they are flexible. As a result, the multilayer piezoelectric element is less likely hindered from deforming, even though the pair of external electrodes extend along the pair of principal faces.

The piezoelectric vibration apparatus pertaining to a mode of the present invention comprises the aforementioned multilayer piezoelectric element, a vibration plate, and an adhesive layer.

The vibration plate faces the multilayer piezoelectric element in the thickness direction.

The adhesive layer is placed between the multilayer piezoelectric element and the vibration plate.

The electronic device pertaining to a mode of the present invention comprises the aforementioned multilayer piezoelectric element, a panel, and a housing.

The panel has the multilayer piezoelectric element adhered to it in a manner facing the panel in the thickness direction.

The housing retains the panel.

According to the present invention, a multilayer piezoelectric element, a piezoelectric vibration apparatus, and an electronic device, which can ensure a large degree of deformation, can be provided.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are greatly simplified for illustrative purposes and are not necessarily to scale.

DESCRIPTION OF THE SYMBOLS

Figure 1:
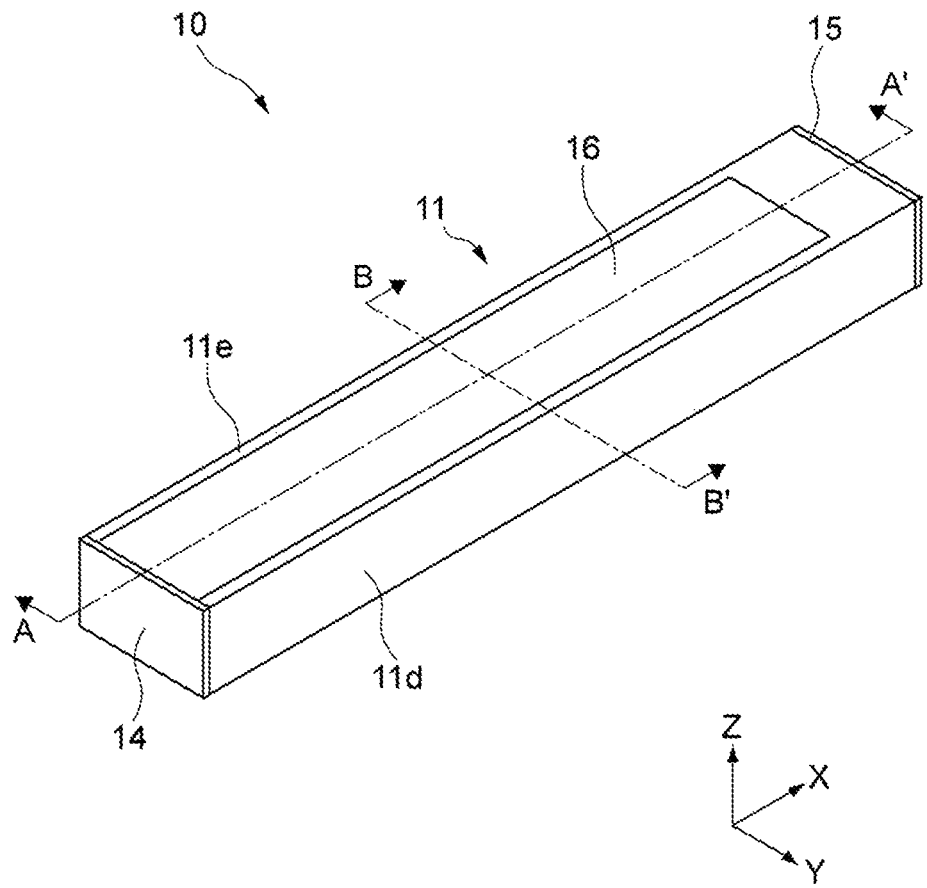
FIG. 1 is a perspective view of the multilayer piezoelectric element pertaining to an embodiment of the present invention.

10—Multilayer piezoelectric element
11—Ceramic base body
11a, 11b—End face
11c, 11d—Side face
11e, 11f—Principal face
12, 13—Internal electrode
14, 15—External electrode
16, 17—Surface electrode
18—Ceramic layer
20—Piezoelectric vibration apparatus
21—Vibration plate
22—Adhesive layer
30—Electronic device
31—Housing
32—Panel
P—Pore

DETAILED DESCRIPTION OF EMBODIMENTS

An embodiment of the present invention is explained below by referring to the drawings. In the drawings, the X-axis, Y-axis, and Z-axis, crossing at right angles with one another, are shown as deemed appropriate. The X-axis, Y-axis and Z-axis are the same in all drawings.

[Basic Constitution of Multilayer Piezoelectric Element 10]

Figure 2:
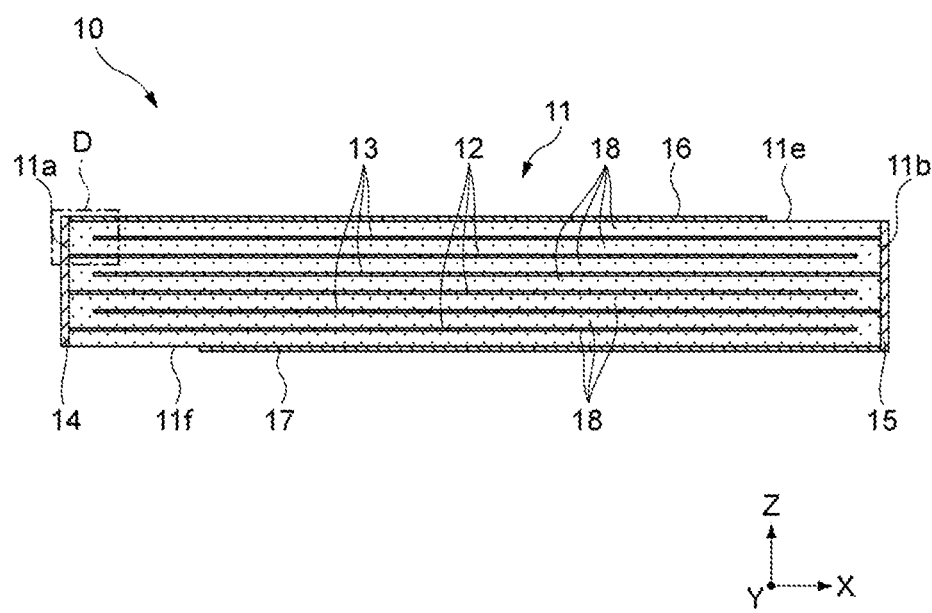
FIG. 2 is a cross-sectional view of the multilayer piezoelectric element along line A-A' in FIG. 1.
Figure 3:
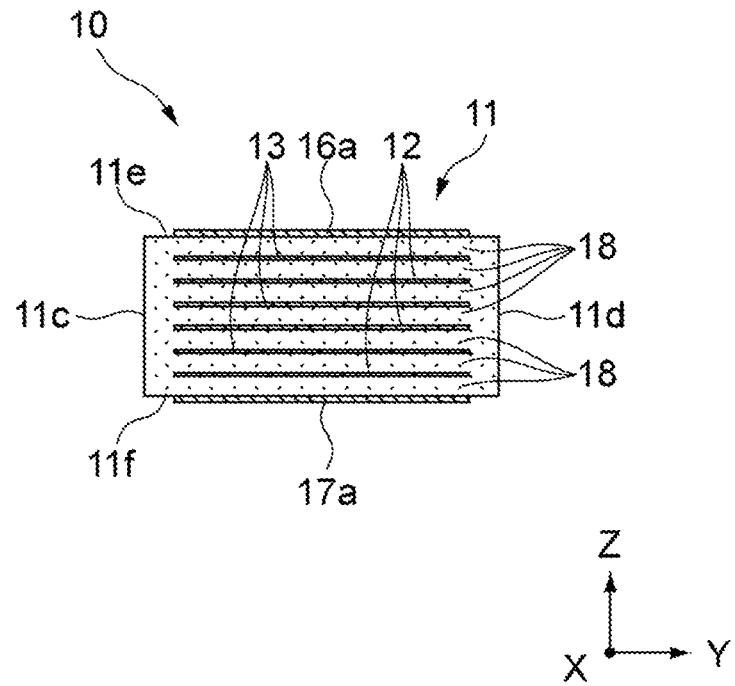
FIG. 3 is a cross-sectional view of the multilayer piezoelectric element along line B-B' in FIG. 1.

FIGS. 1 to 3 are drawings providing schematic representations of the basic constitution of the multilayer piezoelectric element 10 pertaining to an embodiment of the present invention. FIG. 1 is a perspective view of the multilayer piezoelectric element 10. FIG. 2 is a cross-sectional view of the multilayer piezoelectric element 10 along line A-A' in FIG. 1. FIG. 3 is a cross-sectional view of the multilayer piezoelectric element 10 along line B-B' in FIG. 1.

The multilayer piezoelectric element 10 has a longitudinal direction along the X-axis, a width direction along the Y-axis, and a thickness direction along the Z-axis. In other words, the multilayer piezoelectric element 10 is formed elongated in the X-axis direction. This means that, in the case of the multilayer piezoelectric element 10, deformation in the X-axis direction due to the transverse piezoelectric effect is more dominant than deformation in the Z-axis direction due to the longitudinal piezoelectric effect.

The multilayer piezoelectric element 10 comprises a ceramic base body 11, a first external electrode 14, and a second external electrode 15. The ceramic base body 11 has first and second end faces 11a, 11b facing the X-axis direction, first and second side faces 11c, 11d facing the Y-axis direction, and first and second principal faces 11e, 11f facing the Z-axis direction.

It should be noted that the shape of the ceramic base body 11 is not limited to a rectangular solid as shown in FIGS. 1 to 3. For example, the ridge parts connecting the respective faces of the ceramic base body 11 may be chamfered. Also, each face of the ceramic base body 11 may be a curved face, and the ceramic base body 11 may have a rounded shape as a whole.

The first external electrode 14 covers the first end face 11a of the ceramic base body 11. The second external electrode 15 covers the second end face 11b of the ceramic base body 11. The external electrodes 14, 15 may cover the end faces 11a, 11b completely, as shown in FIGS. 1 and 2, or allow the end faces 11a, 11b to be exposed partially.

The external electrodes 14, 15 are formed by a good electrical conductor. Good electrical conductors by which to form the external electrodes 14, 15 include metals such as copper (Cu), nickel (Ni), tin (Sn), palladium (Pd), platinum (Pt), silver (Ag), gold (Au), etc., or alloys whose primary component is any of the foregoing, for example.

The ceramic base body 11 is formed by a piezoelectric ceramic whose absolute value of piezoelectric constant $d_{31}$ is large. Lead-free materials include materials based on lithium niobate ($LiNbO_3$) and lithium tantalate ($LiTaO_3$), for example. Lead materials include materials based on lead zirconate titanate ($PbZrO_3$—$PbTiO_3$), for example.

First internal electrodes 12 and second internal electrodes 13 are provided inside the ceramic base body 11. Both internal electrodes 12, 13 are sheet-shaped and extend along the XY plane, and are placed alternately along the Z-axis direction with spacing between. In other words, the internal electrodes 12, 13 are covered by the piezoelectric ceramic.

This means that ceramic layers 18, which are layers of the piezoelectric ceramic, are formed between the internal electrodes 12, 13. The first internal electrodes 12 are led out to the first end face 11a of the ceramic base body 11, and connected to the first external electrode 14. The second internal electrodes 13 are led out to the second end face 11b of the ceramic base body 11, and connected to the second external electrode 15.

As shown in FIG. 3, the internal electrodes 12, 13 are placed with spacing between them and the side faces 11c, 11d. In other words, a side margin part that forms a space is provided in the ceramic base body 11 between the internal electrodes 12, 13 and the side faces 11c, 11d. This ensures insulation property of the internal electrodes 12, 13 at the side faces 11c, 11d.

The ceramic base body 11 has a first surface electrode 16 provided on the first principal face 11e, and a second surface electrode 17 provided on the second principal face 11f. As a result, a ceramic layer 18 is also formed between the top second internal electrode 13 in the Z-axis direction and the first surface electrode 16, and between the bottom first internal electrode 12 in the Z-axis direction and the second surface electrode 17.

The surface electrodes 16, 17 are formed thicker than the internal electrodes 12, 13 in the Z-axis direction. This ensures continuity of the surface electrodes 16, 17 along the XY plane. It also increases the strength of the surface electrodes 16, 17, which makes the surface electrodes 16, 17 less vulnerable to damage from effects of the external environment.

In addition, the surface electrodes 16, 17 are constituted by a porous conductor, and thus flexible. As a result, the surface electrodes 16, 17 less likely hinder deformation of the multilayer piezoelectric element 10, even though they are thicker than the internal electrodes 12, 13. It should be noted that the volume of pores P distributed in the surface electrodes 16, 17 is smaller than the volume of pores P distributed in the external electrodes 14, 15 described below (refer to FIG. 4).

The first surface electrode 16 is led out to the first end face 11a of the ceramic base body 11 and connected to the first external electrode 14, just like the first internal electrodes 12. Also, the second surface electrode 17 is led out to the second end face 11b of the ceramic base body 11 and connected to the second external electrode 15, just like the second internal electrodes 13.

The internal electrodes 12, 13 and surface electrodes 16, 17 are formed by a good electrical conductor, respectively. Good electrical conductors by which to form the internal electrodes 12, 13 and surface electrodes 16, 17 include metals such as nickel (Ni), copper (Cu), palladium (Pd), platinum (Pt), silver (Ag), gold (Au), etc., or alloys whose primary component is any of the foregoing, for example.

According to the aforementioned constitution, applying voltage between the first external electrode 14 and the second external electrode 15, of the multilayer piezoelectric element 10, causes voltage to be applied to all ceramic layers 18 in the Z-axis direction. As a result, each ceramic layer 18 contracts in the X-axis direction due to the transverse piezoelectric effect and therefore the multilayer piezoelectric element 10 as a whole contracts in the X-axis direction.

The multilayer piezoelectric element 10 can be widely used as a piezoelectric actuator that operates in the X-axis direction due to the transverse piezoelectric effect. A piezoelectric vibration apparatus is an example of application of the multilayer piezoelectric element 10. The piezoelectric vibration apparatus is typically constituted by combining the multilayer piezoelectric element 10 with a vibration plate formed by a metal.

To be more specific, the piezoelectric vibration apparatus is such that the first principal face 11e side or second principal face 11f side of the multilayer piezoelectric element 10 is adhered to the mounting surface of the vibration plate, for example. The piezoelectric vibration apparatus allows the vibration plate to be vibrated by applying voltage of a prescribed frequency between the external electrodes 14, 15 to expand/contract the multilayer piezoelectric element 10 in the longitudinal direction.

It should be noted that the basic constitution of the multilayer piezoelectric element 10 pertaining to this embodiment is not limited to the constitution shown in FIGS. 1 to 3, and can be modified as deemed appropriate.

For example, the numbers of internal electrodes 12, 13 or the ceramic layer 18 thickness can be determined in any way as deemed appropriate according to the application, etc., of the multilayer piezoelectric element 10. Additionally, the constitution of the surface electrodes 16, 17 can be modified according to the constitution of the internal electrodes 12, 13.

To be specific, when a first internal electrode 12 is placed at the top in the Z-axis direction, the first surface electrode 16 is led out to the second end face 11b and connected to a second internal electrode 13. Also, when a second internal electrode 13 is placed at the bottom in the Z-axis direction, the second surface electrode 17 is led out to the first end face 11a and connected to a first internal electrode 12.

[Detailed Constitution of External Electrodes 14, 15]

The external electrodes 14, 15 of the multilayer piezoelectric element 10 are constituted by a porous conductor. On the other hand, the surface electrodes 16, 17 are constituted by a conductor having a smaller volume of pores P than do the external electrodes 14, 15, in order to ensure their continuity along the XY plane. In other words, the conductor constituting the external electrodes 14, 15 is more porous than the conductor constituting the surface electrodes 16, 17.

Figure 4:
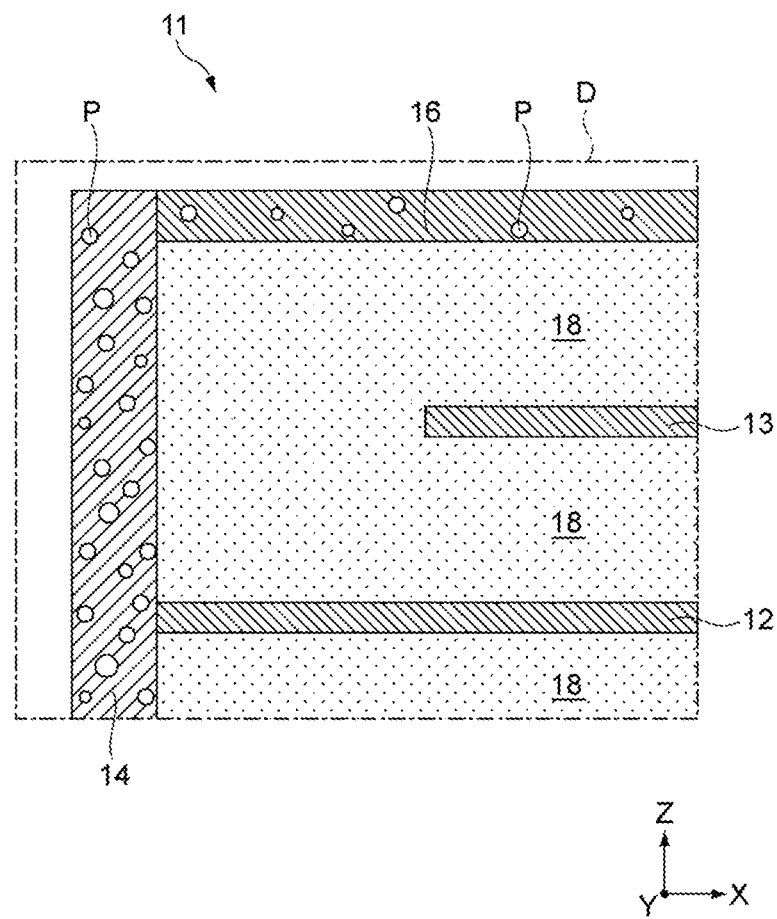
FIG. 4 is a partially enlarged cross-sectional view of region D of the multilayer piezoelectric element in FIG. 2.

FIG. 4 is a partially enlarged cross-sectional view of region D enclosed by the dashed-dotted line in FIG. 2. FIG. 4 provides a schematic representation of the first external electrode 14 and the first surface electrode 16. It should be noted that the second external electrode 15 is constituted in the same manner as the first external electrode 14. Also, the second surface electrode 17 is constituted in the same manner as the first surface electrode 16.

In the conductor constituting the external electrodes 14, 15, more void-forming fine pores P are distributed than in the conductor constituting the surface electrodes 16, 17. The external electrodes 14, 15 are lightweight per volume due to the presence of pores P. As a result, the multilayer piezoelectric element 10 is less likely hindered, by the weight of the external electrodes 14, 15, from deforming in the X-axis direction.

Because of this, the multilayer piezoelectric element 10 achieves a large degree of deformation in the X-axis direction. Furthermore, the lightweight external electrodes 14, 15 are not subject to much inertial force. Accordingly, the external electrodes 14, 15 are more likely to move relatively in the X-axis direction by following the deformation of the ceramic base body 11. As a result, the multilayer piezoelectric element 10 achieves quick response performance.

The volumes of pores P distributed in the external electrodes 14, 15 and surface electrodes 16, 17 can be evaluated as porosities. The porosities can be obtained as the area ratios of pores P in prescribed regions (average regions) in photographs capturing cross sections (randomly selected average cross sections) of the external electrode 14, 15 and surface electrode 16, 17. Sections of the external electrodes 14, 15 and surface electrodes 16, 17 can be captured using, for example, a scanning electron microscope, etc. In some embodiments, pores P are defined as pores having a width in a range of about 0.5 nm to about 50 nm, which include micropores and mesopores.

In the case of the multilayer piezoelectric element 10, preferably the porosity of the external electrodes 14, 15 is 5 percent or higher, in order to increase the degree of deformation in the X-axis direction more effectively. On the other hand, preferably the porosity of the external electrodes 14, 15 is kept to 15 percent or lower, in order to prevent the external electrodes 14, 15 from losing their electrode function. In some embodiments, the porosity of the external electrodes is at least about 1.1 times (preferably at least about 1.2 times) higher than that of the surface electrodes.

[Method for Manufacturing Multilayer Piezoelectric Element 10]

Figure 5:
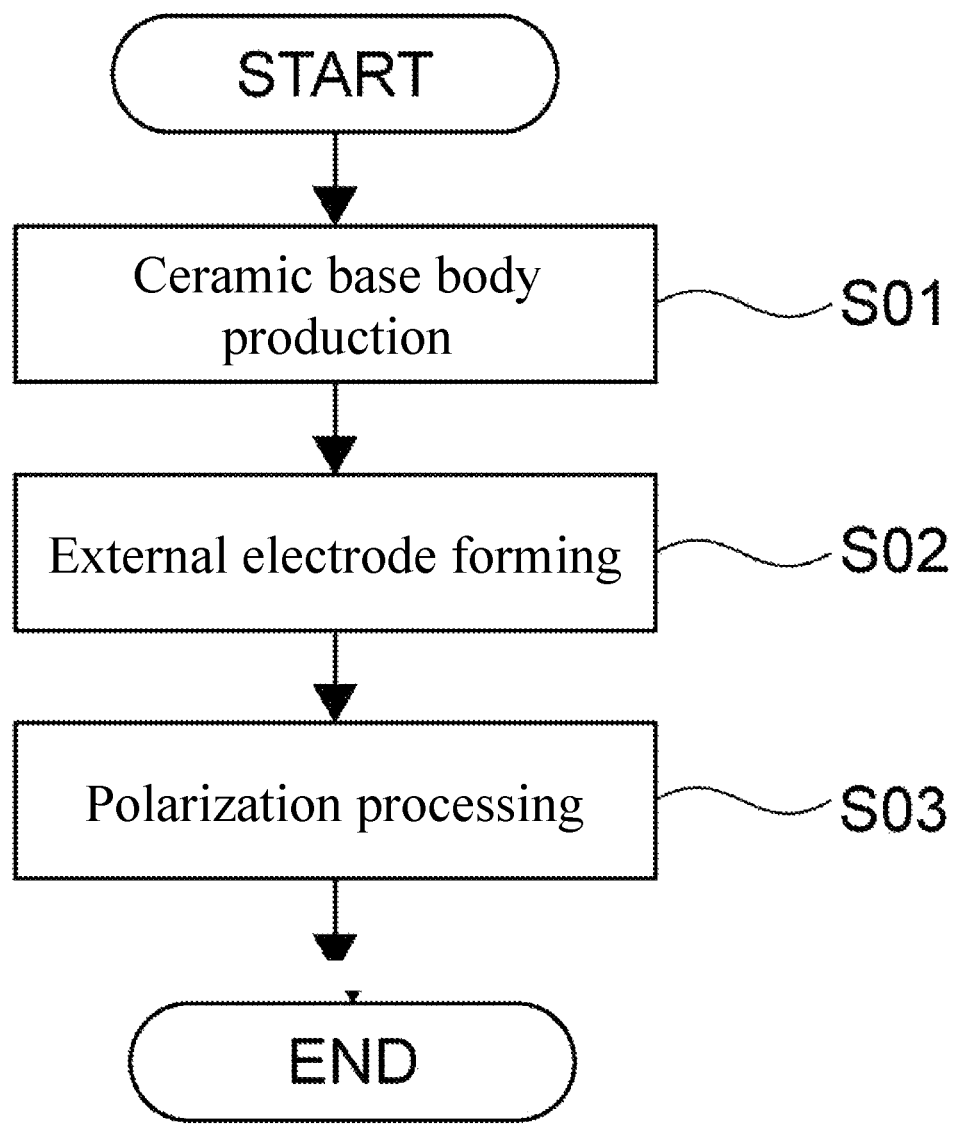
FIG. 5 is a flow chart showing a method for manufacturing the multilayer piezoelectric element.
Figure 6:
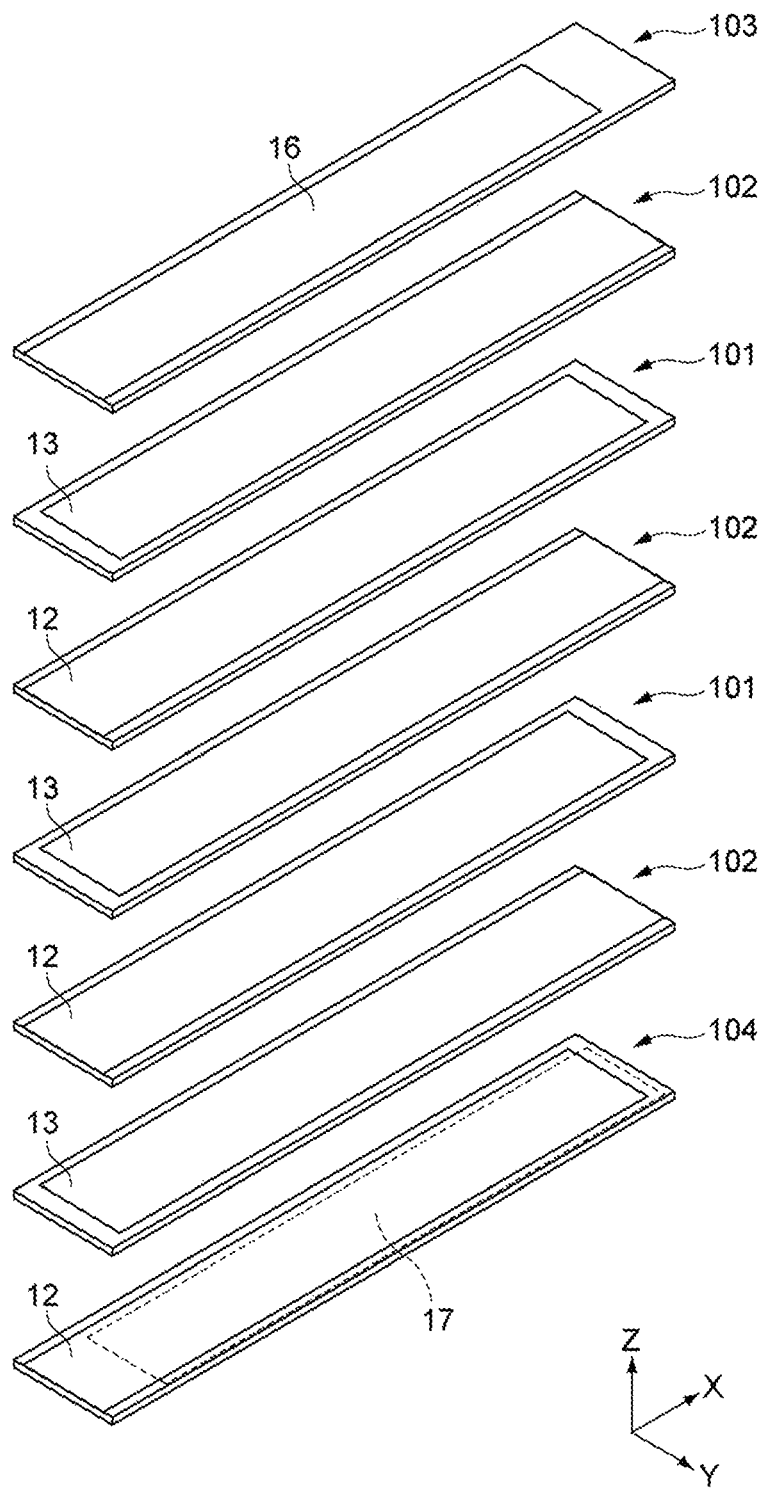
FIG. 6 is a perspective view showing a process for manufacturing the multilayer piezoelectric element.
Figure 7:
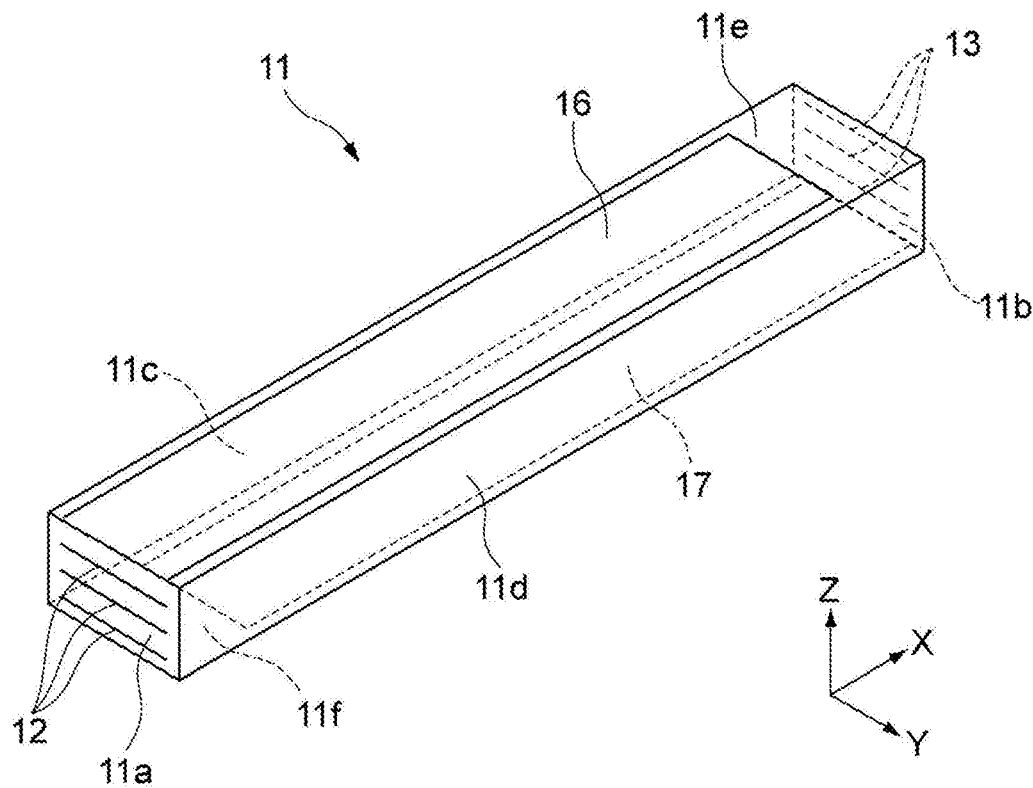
FIG. 7 is a perspective view showing a process for manufacturing the multilayer piezoelectric element.

FIG. 5 is a flow chart showing the method for manufacturing the multilayer piezoelectric element 10. FIGS. 6 and 7 are drawings showing the process of manufacturing the multilayer piezoelectric element 10. The following explains the method for manufacturing the multilayer piezoelectric element 10 according to FIG. 5, by referring to FIGS. 6 and 7 as deemed appropriate.

(Step S01: Ceramic Base Body Production)

In step S01, a ceramic base body 11 is produced. In step S01, first the ceramic sheets 101, 102, 103, 104 shown in FIG. 6 are prepared. The ceramic sheets 101, 102, 103, 104 are piezoelectric green sheets whose primary component is a piezoelectric ceramic.

The piezoelectric green sheets are obtained by forming into sheet shapes a ceramic slurry obtained as a mixture of tentatively sintered piezoelectric ceramic powder, organic polymer binder, and plasticizer. A roll coater, doctor blade, etc., may be used to form the piezoelectric green sheets, for example.

On each of the ceramic sheets 101, 102, 103, 104, a conductive paste is applied in a prescribed pattern, thus forming unsintered internal electrodes 12, 13 and surface electrodes 16, 17. The screen printing method, gravure printing method, etc., may be used to apply the conductive paste, for example.

To be specific, the first internal electrodes 12 are formed on the ceramic sheets 101. The second internal electrodes 13 are formed on the ceramic sheets 102. The first surface electrode 16 is formed on the ceramic sheet 103. The first internal electrode 12 and second surface electrode 17 are formed on the ceramic sheet 104.

And, by stacking the ceramic sheets 101, 102, 103, 104 in the Z-axis direction in the order shown in FIG. 6 and then thermally pressure-bonding them, an unsintered ceramic base body 11 is obtained. Uniaxial pressurization, hydrostatic pressurization, etc., may be used to thermally pressure-bond the ceramic sheets 101, 102, 103, 104, for example.

Next, the unsintered ceramic base body 11 is put through binder removal processing by heating it to a temperature between 300 and 500° C., for example. After completing the binder removal processing, the ceramic base body 11 is sintered by heating it to a temperature between 900 and 1200° C., for example. As a result, the ceramic base body 11 shown in FIG. 7 is obtained.

The porosity of the surface electrodes 16, 17 may be adjusted by, for example, the quantities of the components of the conductive paste, such as binder and solvent, and the conditions under which the conductive paste is applied. Additionally, the porosity of the surface electrodes 16, 17 may also be adjusted by changing the volume of air bubbles present in the conductive paste.

(Step S02: External Electrode Forming)

In step S02, external electrodes 14, 15 are formed on the ceramic base body 11 obtained in step S01, to produce the multilayer piezoelectric element 10 shown in FIGS. 1 to 3. In step S02, external electrodes 14, 15 may be formed by, for example, baking a conductive paste that has been applied on the end faces 11a, 11b of the ceramic base body 11.

The conductive paste may be applied on the end faces 11a, 11b of the ceramic base body 11 using any of the various printing methods, or the dip coating method, for example. In addition, the conductive paste applied on the end faces 11a, 11b of the ceramic base body 11 is baked by heating. This way, a multilayer piezoelectric element 10 on which external electrodes 14, 15 have been formed, is obtained.

The porosity of the external electrodes 14, 15 may be adjusted by, for example, the quantities of the components of the conductive paste, such as binder and solvent, and the conditions under which the conductive paste is applied. Additionally, the porosity of the external electrodes 14, 15 may also be adjusted by changing the volume of air bubbles present in the conductive paste. In some embodiments, in order to, at least one of the above-mentioned variables is set differently from those for the surface electrodes in a manner making the porosity of the external electrodes higher than that of the surface electrodes.

It should be noted that the processing in step S02 may be performed in step S01. For example, the conductive paste in unsintered state may be applied on the end faces 11a, 11b of the unsintered ceramic base body 11 in the X-axis direction. This way, the ceramic base body 11 can be sintered and the external electrodes 14, 15 baked at the same time.

In addition, the method for forming external electrodes 14, 15 is not limited to the foregoing, and any known method may be adopted as deemed appropriate. For example, external electrodes 14, 15 may be formed using the sputtering method. In this case, external electrodes 14, 15 constituted by a porous conductor are obtained when the sputter rate is sufficiently lowered.

(Step S03: Polarization Processing)

In step S03, the multilayer piezoelectric element 10 is put through polarization processing. To be specific, the polarization processing involves applying a high direct-current electric field oriented in the Z-axis direction, to the multilayer piezoelectric element 10, and thereby aligning the direction of the spontaneous polarization of the piezoelectric ceramic constituting the ceramic layers 18. As a result, piezoelectric activity is added to the piezoelectric ceramic and the multilayer piezoelectric element 10 can now demonstrate this function.

[Piezoelectric Vibration Apparatus 20]

The multilayer piezoelectric element 10 can be widely used as a piezoelectric actuator that operates in the X-axis direction due to the transverse piezoelectric effect. A piezoelectric vibration apparatus that generates vibration is an example of application of the multilayer piezoelectric element 10. The following explains a unimorph-type piezoelectric vibration apparatus 20 constituted with the multilayer piezoelectric element 10.

Figure 8:
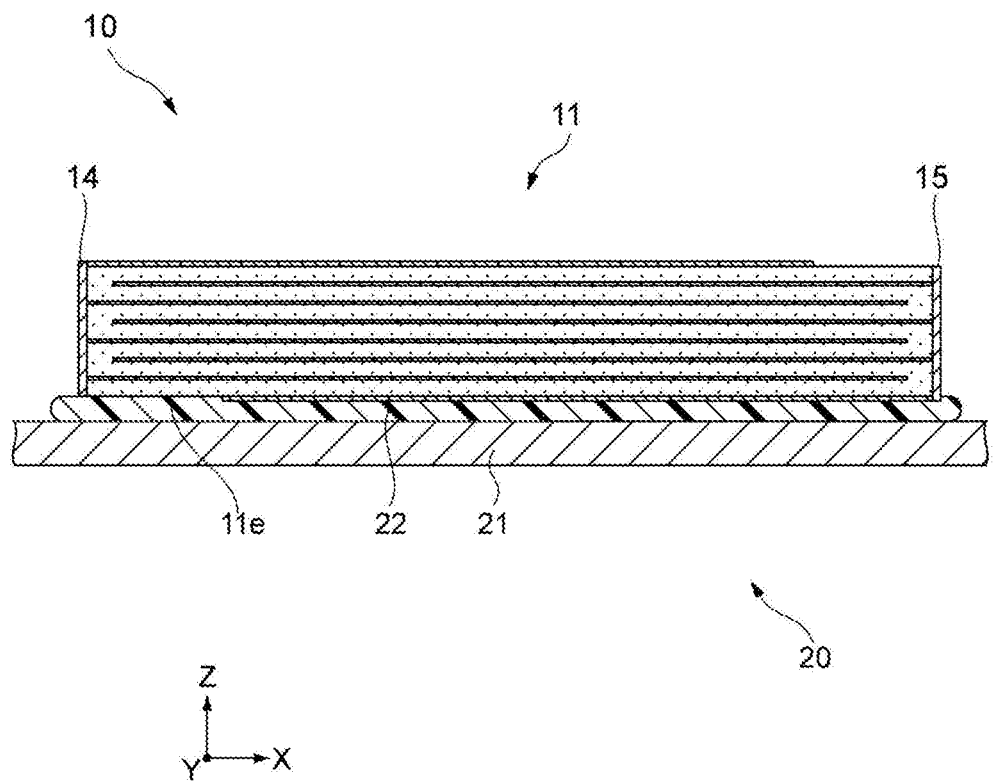
FIG. 8 is a cross-sectional view of a piezoelectric vibration apparatus that uses the multilayer piezoelectric element.

FIG. 8 is a cross-sectional view of the piezoelectric vibration apparatus 20. The piezoelectric vibration apparatus 20 comprises the multilayer piezoelectric element 10, a vibration plate 21, and an adhesive layer 22. The vibration plate 21 is constituted as a flat plate extending along the XY plane, and placed in a manner facing the first principal face 11e of the multilayer piezoelectric element 10. The adhesive layer 22 is placed between the multilayer piezoelectric element 10 and the vibration plate 21.

The vibration plate 21 is formed by a metal, glass, etc., for example, and has flexibility in the Z-axis direction. The adhesive layer 22 is formed by a resin material, etc., and joins the multilayer piezoelectric element 10 and the vibration plate 21. The adhesive layer 22 adheres to the bottom part of the multilayer piezoelectric element 10 in the Z-axis direction, and to the top face of the vibration plate 21 in the Z-axis direction.

The adhesive layer 22 is filled between the first principal face 11e of the ceramic base body 11 and the vibration plate 21, and joins the ceramic base body 11 and the vibration plate 21 over a wide range. As a result, the piezoelectric vibration apparatus 20 achieves high joining strength between the multilayer piezoelectric element 10 and the vibration plate 21 via the adhesive layer 22.

In the piezoelectric vibration apparatus 20, the high joining strength between the multilayer piezoelectric element 10 and the vibration plate 21 due to the adhesive layer 22 prevents the multilayer piezoelectric element 10 from easily separating from the vibration plate 21, even when the multilayer piezoelectric element 10 is caused to expand/contract greatly. Because of this, the piezoelectric vibration apparatus 20 maintains a high vibration of the vibration plate 21.

[Electronic Device 30]

Figure 9A:
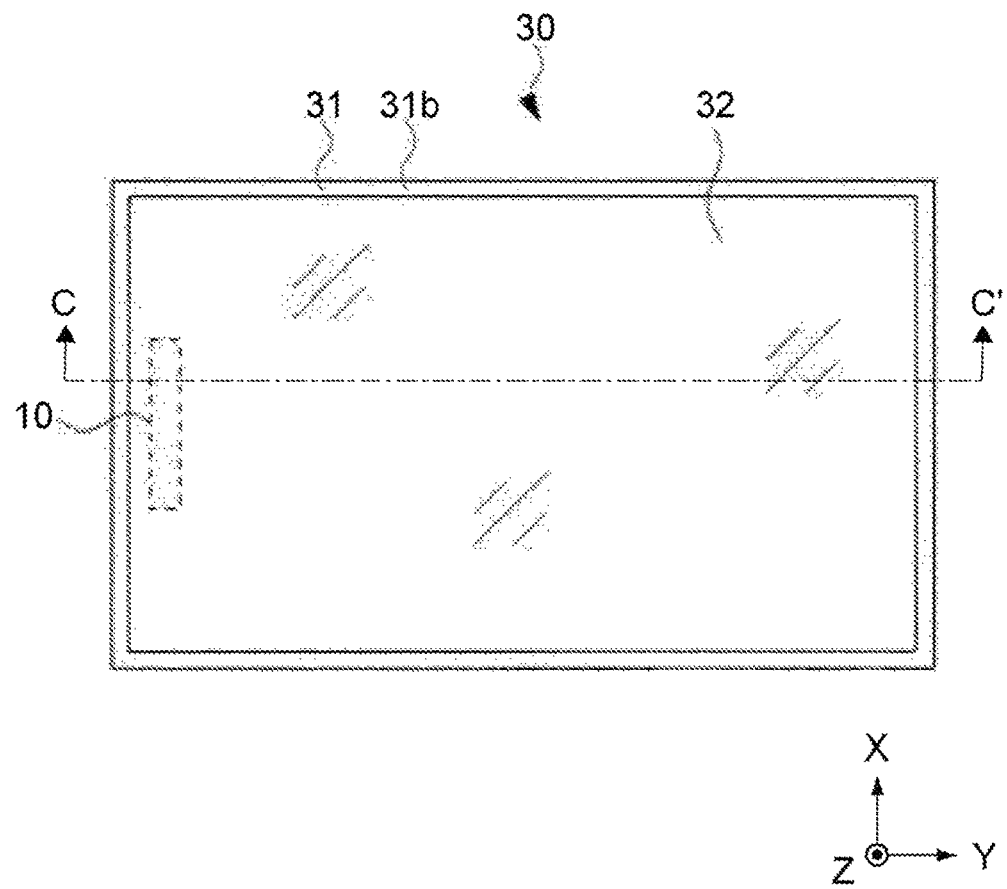
FIG. 9A is a plan view of an electronic device that uses the multilayer piezoelectric element.
Figure 9B:
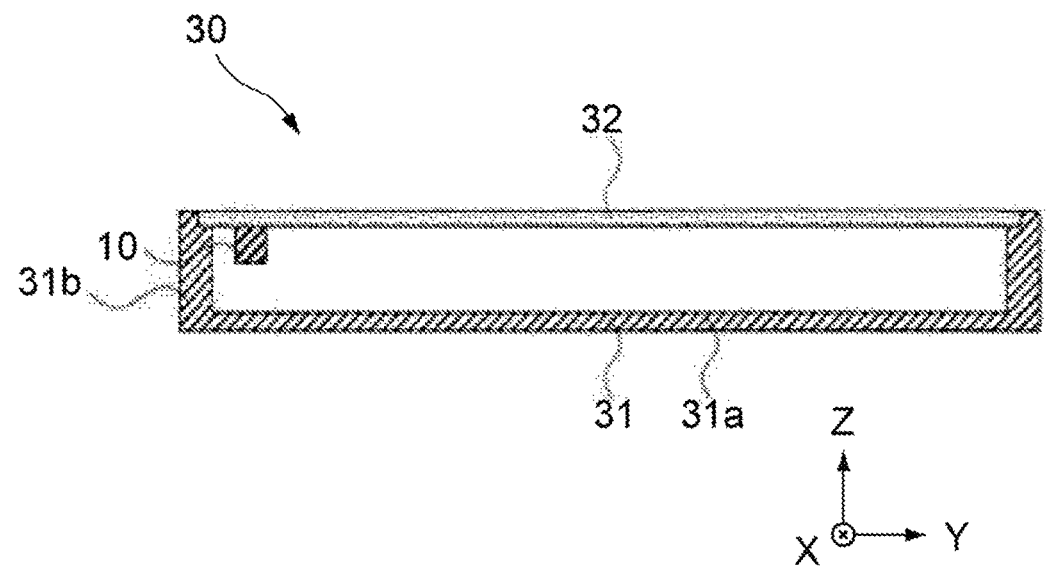
FIG. 9B is a cross-sectional view of the electronic device along line C-C' in FIG. 9A.

FIGS. 9A and 9B are drawings showing schematic representations of an electronic device 30 that uses the multilayer piezoelectric element 10. FIG. 9A is a plan view of the electronic device 30. FIG. 9B is a cross-sectional view of the electronic device 30 along line C-C' in FIG. 9A. The electronic device 30 is constituted as a multifunctional mobile communication terminal generally referred to as a "smartphone."

The electronic device 30 has the multilayer piezoelectric element 10, a housing 31, and a panel 32. The housing 31 has a bottom plate 31a extending rectangularly along the XY plane and a frame body 31b extending from the periphery of the bottom plate 31a upward in the Z-axis direction, and is formed as a box shape that opens upward in the Z-axis direction. The panel 32 extends rectangularly along the XY plane and closes the housing 31 from above in the Z-axis direction.

The housing 31 houses each constitution (not illustrated) of circuit boards, electronic components, etc., for achieving the various functions of the electronic device 30. The panel 32 is constituted as a touch panel. In other words, the panel 32 provides both an image display function to display images and an input function to detect input operations performed by the user using a finger, etc.

It should be noted that the panel 32 is not limited to a touch panel, and also it need not have the constitution described above. For example, the panel 32 may be a touch pad that does not have an image display function, but has only an input function. Also, the panel 32 may be a protective panel that protects a touch panel provided separately as part of the electronic device 30.

The multilayer piezoelectric element 10 is adhered to the bottom face of the panel 32 in the Z-axis direction and faces the bottom plate 31a inside the housing 31. The position of the multilayer piezoelectric element 10 on the bottom face of the panel 32 in the Z-axis direction can be determined in any way as desired. In the electronic device 30, the panel 32 fulfills the function the vibration plate 21 provides in the piezoelectric vibration apparatus 20 shown in FIG. 8.

To be specific, the electronic device 30 allows the panel 32 to vibrate as a result of the multilayer piezoelectric element 10 extending/contracting in the X-axis direction. For this reason, preferably the panel 32 is made primarily of a glass, acrylic resin, or other material that can vibrate in a favorable manner. Also, the adhesive layer that adheres the multilayer piezoelectric element 10 and the panel 32 is constituted in the same way as the adhesive layer 22 in the piezoelectric vibration apparatus 20.

The electronic device 30 can generate sound via air conduction, bone conduction, etc., by vibrating the panel 32, to provide sound information to the user. Also, the electronic device 30 can vibrate the panel 32 to, for example, present haptic sensations to the user who performs input operations on the panel 32.

It should be noted that, while the top face of the panel 32 in the Z-axis direction is typically a flat surface, it may also be a warped surface, etc., for example. In addition, the electronic device 30 is not limited to a smartphone, and it may also be constituted as a tablet terminal, notebook personal computer, mobile phone, watch, photo stand, or a remote control or operating part, etc., of various types of devices.

Other Embodiments

The foregoing explained an embodiment of the present invention, but it goes without saying that the present invention is not limited to the aforementioned embodiment and various modifications can be added. As an example of such other embodiment, the multilayer piezoelectric element 10 pertaining to a variation example of the aforementioned embodiment is explained.

Figure 10:
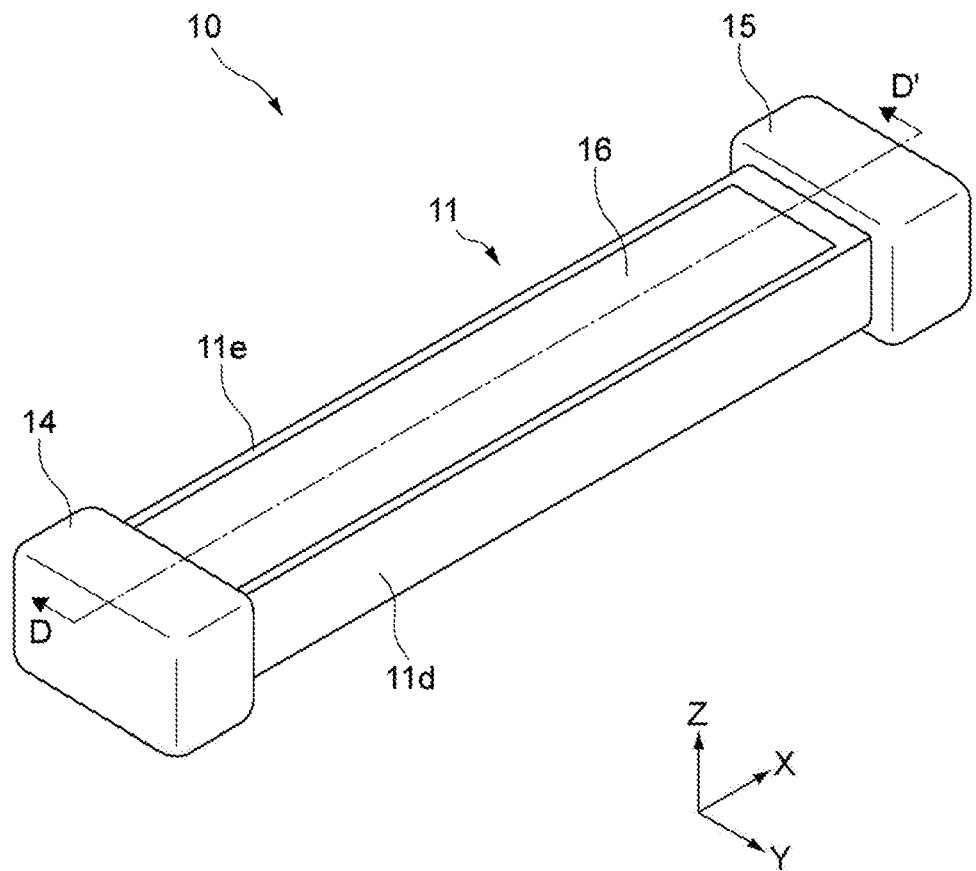
FIG. 10 is a perspective view of a variation example of the multilayer piezoelectric element.
Figure 11:
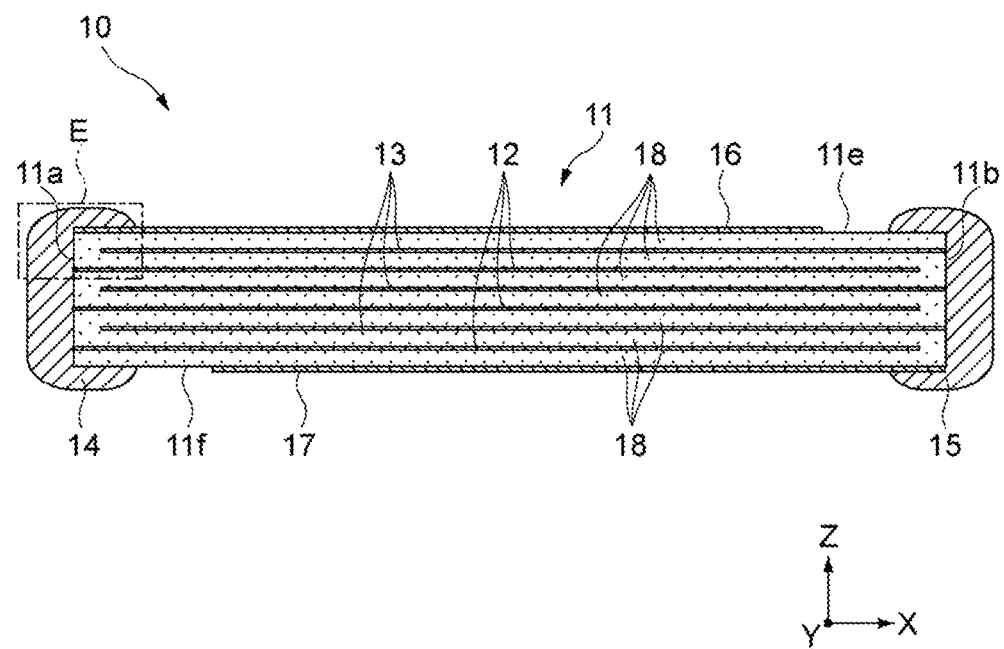
FIG. 11 is a cross-sectional view of the multilayer piezoelectric element along line D-D' in FIG. 10.

FIGS. 10 and 11 are drawings showing the multilayer piezoelectric element 10 pertaining to a variation example of the aforementioned embodiment. FIG. 10 is a perspective view of the multilayer piezoelectric element 10. FIG. 11 is a cross-sectional view of the multilayer piezoelectric element 10 along line D-D' in FIG. 10. With the multilayer piezoelectric element 10 pertaining to the variation example, the constitution of external electrodes 14, 15 is different from the aforementioned embodiment.

With the multilayer piezoelectric element 10 pertaining to the variation example, the first external electrode 14 extends from the first end face 11a of the ceramic base body 11 along the side faces 11c, 11d and principal faces 11e, 11f, and overlaps the first surface electrode 16 on the first principal face 11e. This achieves good connectivity between the first external electrode 14 and the first surface electrode 16.

Also, with the multilayer piezoelectric element 10 pertaining to the variation example, the second external electrode 15 extends from the second end face 11b of the ceramic base body 11 along the side faces 11c, 11d and principal faces 11e, 11f, and overlaps the second surface electrode 17 on the second principal face 11f. This achieves good connectivity between the second external electrode 15 and the second surface electrode 17.

Figure 12:
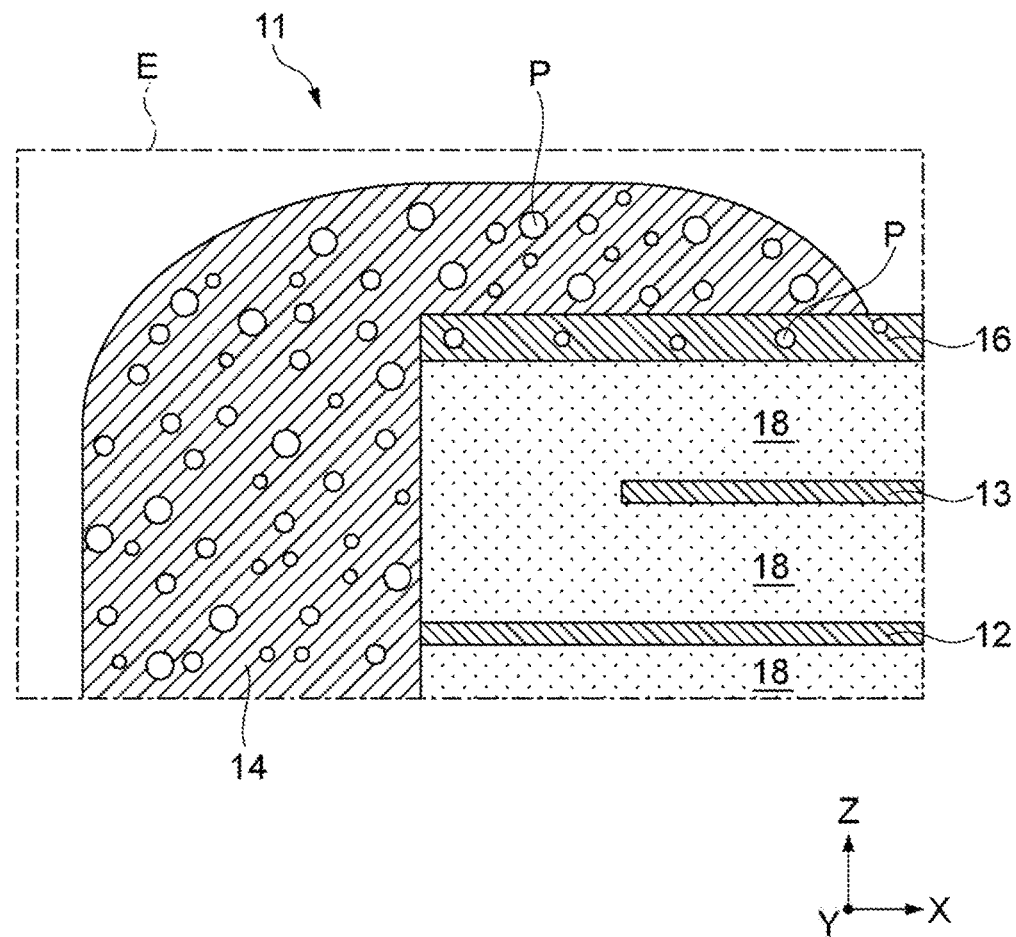
FIG. 12 is a partially enlarged cross-sectional view of region E of the multilayer piezoelectric element in FIG. 10.

FIG. 12 is a partially enlarged cross-sectional view of region E enclosed by the dashed-dotted line in FIG. 11. The external electrodes 14, 15 are flexible because pores P are distributed in them. Accordingly, the parts of the external electrodes 14, 15 that extend along the side faces 11c, 11d and principal faces 11e, 11f can deform in the X-axis direction integrally with the ceramic base body 11.

In other words, the parts of the external electrodes 14, 15 that extend along the side faces 11c, 11d and principal faces 11e, 11f do not restrain the ceramic base body 11 in the X-axis direction and do not hinder the ceramic base body 11 from deforming in the X-axis direction. This means that, with the multilayer piezoelectric element 10, the degree of deformation in the X-axis direction is less likely to be lost due to the external electrodes 14, 15.

The external electrodes 14, 15 of the multilayer piezoelectric element 10 pertaining to the variation example can be easily formed using the dip coating method, for example. It should be noted that, with the multilayer piezoelectric element 10 pertaining to the variation example, the external electrodes 14, 15 only need to extend onto the principal faces 11e, 11f, and they need not extend onto at least one of the side faces 11c, 11d.

In the present disclosure where conditions and/or structures are not specified, a skilled artisan in the art can readily provide such conditions and/or structures, in view of the present disclosure, as a matter of routine experimentation. Also, in the present disclosure including the examples described above, any ranges applied in some embodiments may include or exclude the lower and/or upper endpoints, and any values of variables indicated may refer to precise values or approximate values and include equivalents, and may refer to average, median, representative, majority, etc. in some embodiments. Further, in this disclosure, "a" may refer to a species or a genus including multiple species, and "the invention" or "the present invention" may refer to at least one of the embodiments or aspects explicitly, necessarily, or inherently disclosed herein. The terms "constituted by" and "having" refer independently to "typically or broadly comprising", "comprising", "consisting essentially of", or "consisting of" in some embodiments. In this disclosure, any defined meanings do not necessarily exclude ordinary and customary meanings in some embodiments.

The present application claims priority to Japanese Patent Application No. 2017-141140, filed Jul. 20, 2017, and No. 2018-045558, filed Mar. 13, 2018, each disclosure of which is incorporated herein by reference in its entirety including any and all particular combinations of the features disclosed therein.

It will be understood by those of skill in the art that numerous and various modifications can be made without departing from the spirit of the present invention. Therefore, it should be clearly understood that the forms of the present invention are illustrative only and are not intended to limit the scope of the present invention.

We claim:

1. A multilayer piezoelectric element comprising:
a ceramic base body formed by a piezoelectric ceramic and having a pair of end faces that are facing in a longitudinal direction and a pair of principal faces that are facing in a thickness direction crossing at right angles with the longitudinal direction;
a pair of external electrodes covering the pair of end faces;
multiple internal electrodes stacked along the thickness direction inside the ceramic base body and connected alternately to the pair of external electrodes in the thickness direction; and
surface electrodes provided on the pair of principal faces, respectively, wherein one of the surface electrodes is connected to one of the external electrodes, to which external electrode the internal electrode immediately adjacent to the one of the surface electrodes in the thickness direction is connected, and the other surface electrodes is connected to the other external electrode, to which external electrode the internal electrode immediately adjacent to the other surface electrode in the thickness direction is connected;
wherein the pair of external electrodes have a higher porosity than the surface electrodes.

2. The multilayer piezoelectric element according to claim 1,
wherein a porosity of the pair of external electrodes is 5 percent or higher but no higher than 15 percent.

3. The multilayer piezoelectric element according to claim 1,
wherein the pair of external electrodes extend from the pair of end faces along the pair of principal faces.

4. A piezoelectric vibration apparatus, comprising:
the multilayer piezoelectric element according to claim 1;
a vibration plate facing the multilayer piezoelectric element in the thickness direction; and
an adhesive layer placed between the multilayer piezoelectric element and the vibration plate.

5. A piezoelectric vibration apparatus, comprising:
the multilayer piezoelectric element according to claim 2;
a vibration plate facing the multilayer piezoelectric element in the thickness direction; and
an adhesive layer placed between the multilayer piezoelectric element and the vibration plate.

6. A piezoelectric vibration apparatus, comprising:
the multilayer piezoelectric element according to claim 3;
a vibration plate facing the multilayer piezoelectric element in the thickness direction; and
an adhesive layer placed between the multilayer piezoelectric element and the vibration plate.

7. An electronic device, comprising:
the multilayer piezoelectric element according to claim 1;
a panel having the multilayer piezoelectric element adhered to it in a manner facing the panel in the thickness direction; and
a housing retaining the panel.

8. An electronic device, comprising:
the multilayer piezoelectric element according to claim 2;
a panel having the multilayer piezoelectric element adhered to it in a manner facing the panel in the thickness direction; and
a housing retaining the panel.

9. An electronic device, comprising:
the multilayer piezoelectric element according to claim 3;
a panel having the multilayer piezoelectric element adhered to it in a manner facing the panel in the thickness direction; and
a housing retaining the panel.

* * * * *